United States Patent
Chua-Eoan et al.

(10) Patent No.: US 7,728,622 B2
(45) Date of Patent: Jun. 1, 2010

(54) SOFTWARE PROGRAMMABLE LOGIC USING SPIN TRANSFER TORQUE MAGNETORESISTIVE RANDOM ACCESS MEMORY

(75) Inventors: Lew Chua-Eoan, Carlsbad, CA (US); Matthew Nowak, San Diego, CA (US); Seung Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/055,794

(22) Filed: Mar. 26, 2008

(65) Prior Publication Data

US 2008/0238475 A1  Oct. 2, 2008

Related U.S. Application Data

(60) Provisional application No. 60/908,767, filed on Mar. 29, 2007.

(51) Int. Cl.
 *G06F 7/38* (2006.01)
 *H03K 19/177* (2006.01)
(52) U.S. Cl. .............................. 326/40; 326/38; 326/39
(58) Field of Classification Search ............. 326/38–41, 326/47
 See application file for complete search history.

(56) References Cited

U.S. PATENT DOCUMENTS

| | | | |
|---|---|---|---|
| 5,959,465 A | | 9/1999 | Beat |
| 6,034,887 A | * | 3/2000 | Gupta et al. ................. 365/171 |
| 6,876,228 B2 | | 4/2005 | Sunaga et al. |
| 7,459,739 B2 | | 12/2008 | Hurst et al. |
| 2005/0280058 A1 | * | 12/2005 | Pakala et al. ................. 257/295 |

OTHER PUBLICATIONS

Rhyne, Fundamentals of Digital Systems Design, N.J., 1973, pp. 70-71.*
Zhao, et al., "Integration of Spin-RAM Technology in FPGA Circuits," 8th International Conference on Solid-State and Integrated Circuit Technology, 2006. ICSICT '06, Oct. 2006, pp. 799-802.
International Search Report—PCT/US08/058927, International Search Authority—European Patent Office, Sep. 15, 2008.
Written Opinion—PCT/US08/058927, International Search Authority—European Patent Office, Sep. 15, 2008.
Kimura et al., "TMR-Based Logic-in-Memory Circuit for Low-Power VLSI", The 2004 International Technical Conference on Circuits/Systems, Computers and Communications (ITC-CSCC2004), Hotel Taikanso, Sendai/Matsushima, Miyagi-Pref., Japan (Jul. 6-8, 2004).
Hosomi et al., "A Novel Nonvolatile Memory with Spin Transfer Torque Magnetoresistive Magnetization Switching: Spin-RAM, " Proceedings of IEDM Conference (2005), pp. 459-462.

* cited by examiner

*Primary Examiner*—Anh Q Tran
(74) *Attorney, Agent, or Firm*—Nicholas J. Pauley; Sam Talpalatsky; Peter Kamarchik

(57) ABSTRACT

Systems, circuits and methods for software programmable logic using Spin Transfer Torque Magnetoresistive Random Access Memory (STT-MRAM) technology are disclosed. Magnetic tunnel junction (MTJ) storage elements can be formed into input planes and output planes. The input planes and output planes can be coupled together to form complex arrays that allow for the realization of logic functions.

20 Claims, 8 Drawing Sheets

PARALLEL MAGNETIZATION
LOW RESISTANCE
STATE "0"

ANTIPARALLEL MAGNETIZATION
HIGH RESISTANCE
STATE "1"

READ & WRITE

SOFTWARE PROGRAMMABLE LOGIC USING SPIN TRANSFER TORQUE MAGNETORESISTIVE RANDOM ACCESS MEMORY

CLAIM OF PRIORITY UNDER 35 U.S.C. §119

The present Application for Patent claims priority to Provisional Application No. 60/908,767 entitled "SOFTWARE PROGRAMMABLE LOGIC USING SPIN TRANSFER TORQUE MAGNETORESISTIVE RANDOM ACCESS MEMORY" filed on Mar. 29, 2007, and assigned to the assignee hereof and hereby expressly incorporated by reference herein.

FIELD OF DISCLOSURE

Embodiments of the invention are related to a programmable logic array (PLA) or a field programmable gate array (FPGA). More particularly, embodiments of the invention are related to a PLA, FPGA or software programmable logic using Spin Transfer Torque Magnetoresistive Random Access Memory (STT-MRAM) technology.

BACKGROUND

A field-programmable gate array is a semiconductor device, which includes programmable logic components called "logic blocks" and programmable interconnects. Logic blocks can be programmed to perform the function of basic logic gates such as AND, and XOR, or more complex combinational functions such as decoders or simple mathematical functions. In most FPGA's, the logic blocks also include memory elements, which may be simple flip-flops or more complete blocks of memories. A hierarchy of programmable interconnects allows logic blocks to be interconnected as needed by the system designer. After the FPGA is manufactured, the system designer may use programming to implement many different logical functions, thereby making the device "field-programmable".

A PLA is similar to a FPGA, except that the PLA is modified, or "programmed", at the fabrication stage of the integrated circuits by changes in one or two masks. As described in U.S. Pat. No. 5,959,465, a PLA having flash EPROM memory elements is generally composed of two logic planes, an input plane and an output plane. Each plane receives inputs which are applied to gate terminals of transistors within the logic plane, and provides outputs to output nodes. The inputs to the input plane are the inputs to the PLA. The outputs of the input plane are intermediate nodes. The inputs to the output plane are connected to the intermediate nodes. The outputs of the output plane are the outputs of the PLA. The input plane may provide an AND function, and the output plane may provide an OR function. Alternatively, both planes may provide a NOR function. These functions are defined by the type and connectivity of the transistors used and the signals applied to their gates. The NOR-NOR configuration has particular advantages in that it is the simplest to implement in CMOS logic. NOR stages have a number of transistors equal to the number of inputs connected in parallel. Addition of further parallel transistors for accommodating further inputs does not affect the operating speed of the stage.

U.S. Pat. No. 6,876,228 describes a FPGA with magnetic storage elements or memory cells known as Magnetoresistive Random Access Memory (MRAM). Connection information is written to the magnetic storage elements. The connection information is serially input and stored in shift registers, which correspond to the magnetic storage elements. When the power is switched on, the connection information stored in the magnetic storage elements is latched by latch elements, and is output to switching circuits to interconnect the logic blocks of the FPGA.

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. As illustrated in FIGS. 1A and 1B, a magnetic tunnel junction (MTJ) storage element 105 can be formed from two magnetic layers 10 and 30, each of which can hold a magnetic field, separated by an insulating (tunnel barrier) layer 20. One of the two layers (e.g., fixed layer 10), is set to a particular polarity. The other layer's (e.g., free layer 30) polarity 32 is free to change to match that of an external field that can be applied. A change in the polarity 32 of the free layer 30 will change the resistance of the MTJ storage element 105. For example, when the polarities are aligned, FIG. 1A, a low resistance state exists. When the polarities are not aligned, FIG. 1B, then a high resistance state exists. The illustration of MTJ 105 has been simplified and those skilled in the art will appreciate that each layer illustrated may comprise one or more layers of materials, as is known in the art.

SUMMARY

Exemplary embodiments of the invention are directed to systems, circuits and methods for software programmable logic using Spin Transfer Torque Magnetoresistive technology.

An embodiment of the invention can include a programmable logic array, comprising: a plurality of spin transfer torque magnetic tunnel junction (MTJ) devices, arranged in an array; and a plurality of programmable sources coupled to corresponding MTJ devices for changing the polarity of a free layer of each MTJ device; wherein a first group of the MTJ devices are arranged into an input plane, wherein a second group of the MTJ devices are arranged into an output plane, and wherein the input plane and the output plane are combined to form a logic function based on the relative polarities of the free layer of each MTJ device.

Another embodiment can include a method for implementing logic in an array comprising: programming each of a plurality of spin transfer torque magnetic tunnel junction (MTJ) devices, arranged in an array to either a high or low resistance state, wherein each MTJ device is programmed by a first programmable source coupled to a free layer side of a selected MTJ device and programmable source coupled to a fixed layer side of the selected MTJ device; arranging a first group of the MTJ devices into columns and rows of an input plane; arranging a second group of the MTJ devices into at least one column in an output plane, wherein outputs of each row are coupled the MTJ devices in the at least one column; and determining a logic function based on the relative resistances of each MTJ device.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of embodiments of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Embodiments of the invention use Spin Transfer Torque Magnetoresistive Random Access Memory (STT-MRAM) elements to form part of the logic array. STT-MRAM uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing.

Figure 1A:
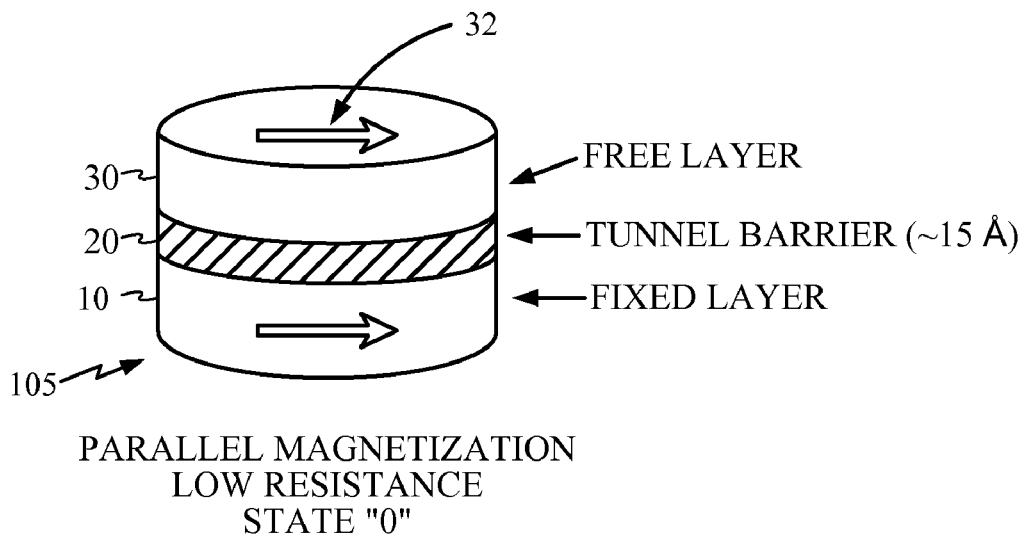
FIGS. 1A and 1B are illustrations of magnetic tunnel junction (MTJ) storage elements and their related states.
Figure 1B:
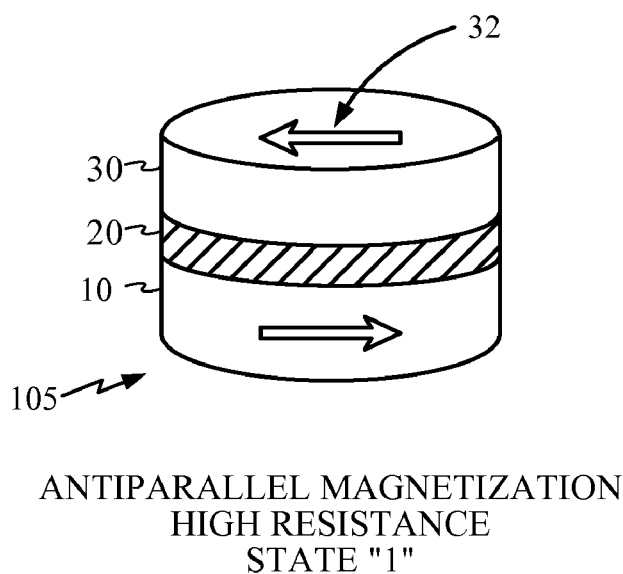
Figure 1C:
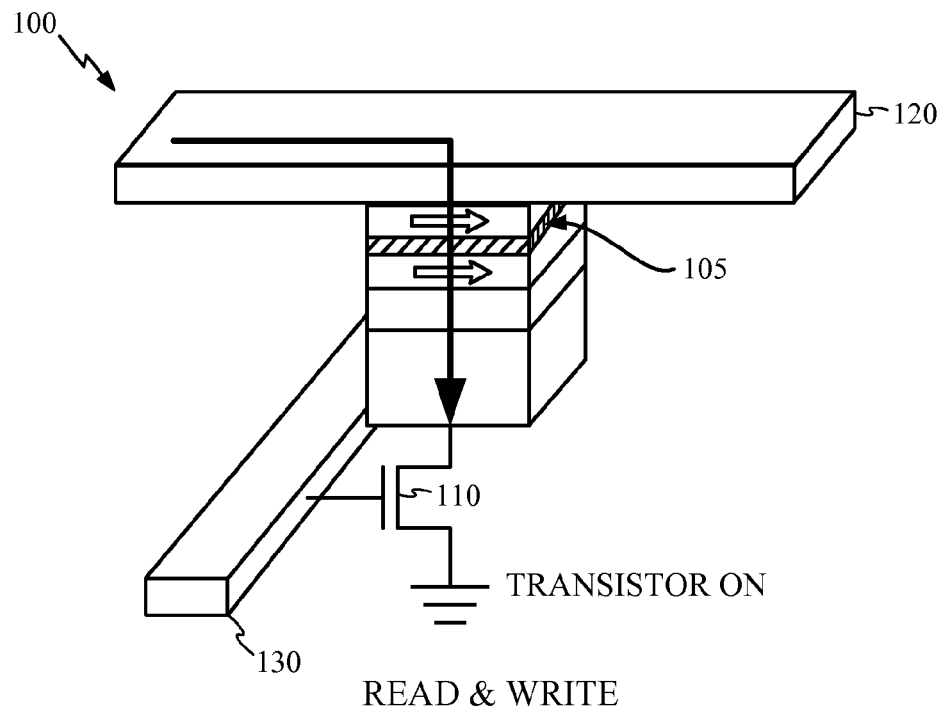
FIGS. 1C and 1D are illustrations of Spin Transfer Torque Magnetoresistive Random Access Memory (STT-MRAM) bit cells.

Referring now to FIG. 1C, an example of a STT-MRAM bit cell 100 is illustrated to aid in an explanation of programming MTJ 105. STT-MRAM bit cell 100 includes MTJ 105, transistor 110, bit line 120 and word line 130. The transistor 110 is switched on for both read and write operations to allow current to flow through the MTJ 105, so that the logic state can be read or written. The logic state of the MTJ 105 in the STT-MRAM is written electrically, as opposed to a magnetic write in conventional MRAM.

Figure 1D:
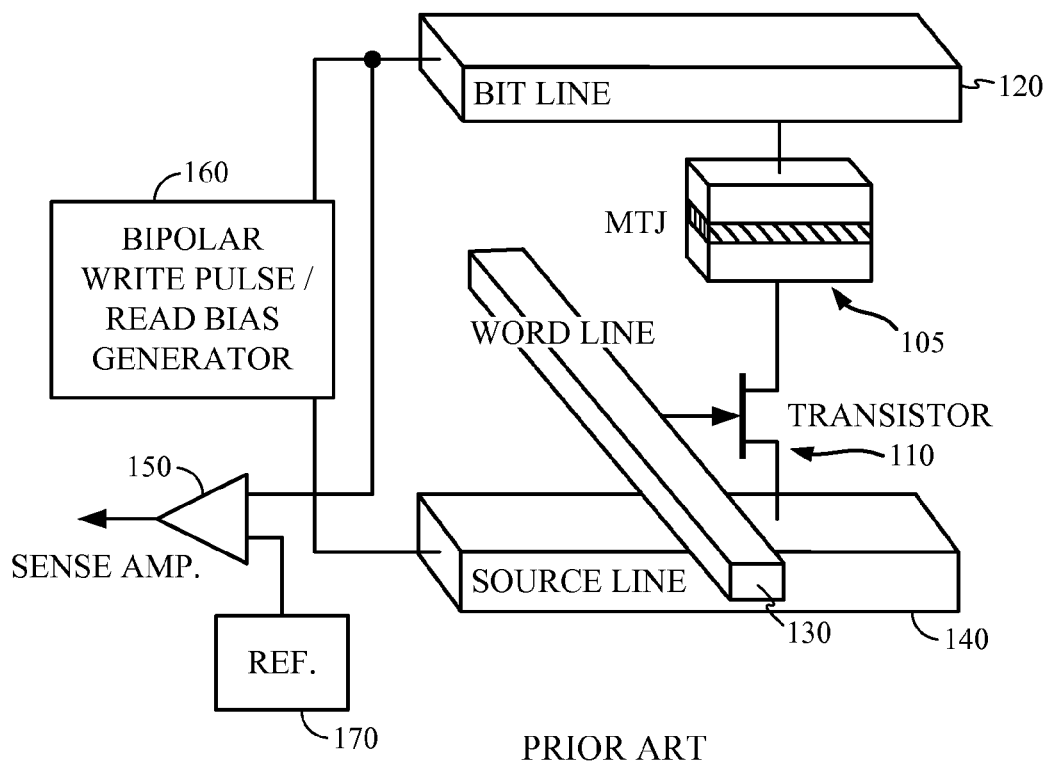

Referring to FIG. 1D, a more detailed diagram of a STT-MRAM cell 101 is illustrated, for further discussion of the read/write operations. In addition to the previously discussed elements such as MTJ 105, transistor 110, bit line 120 and word line 130, a source line 140, sense amplifier 150, read/write circuitry 160 and bit line reference 170 are illustrated. In contrast to MRAM, the write operation in an STT-MRAM is electrical. Read/write circuitry 160 generates a write voltage between the bit line 120 and the source line 140. Depending on the polarity of the voltage between bit line 120 and source line 140, the polarity of the free layer of the MTJ 105 can be changed and correspondingly the logic state can be written to the cell 101. Likewise, during a read operation, a read current is generated, which flows between the bit line 120 and source line 140 through MTJ 105. When the current is permitted to flow via transistor 110, the resistance (logic state) of the MTJ 105 can be determined based on the voltage differential between the bit line 120 and source line 140, which is compared to a reference 170 and then amplified by sense amplifier 150. The operation and construction of the memory cell 101 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

Among other aspects, embodiments of the invention take advantage of the low power, static memory, and electrical read/write features of the STT technology discussed above. Embodiments of the invention provide many features including: extensible hardware; scalability through process generations; reconfigurability; no initialization; low standby leakage and state/program retention; small dimensions; and high speed.

Figure 2:
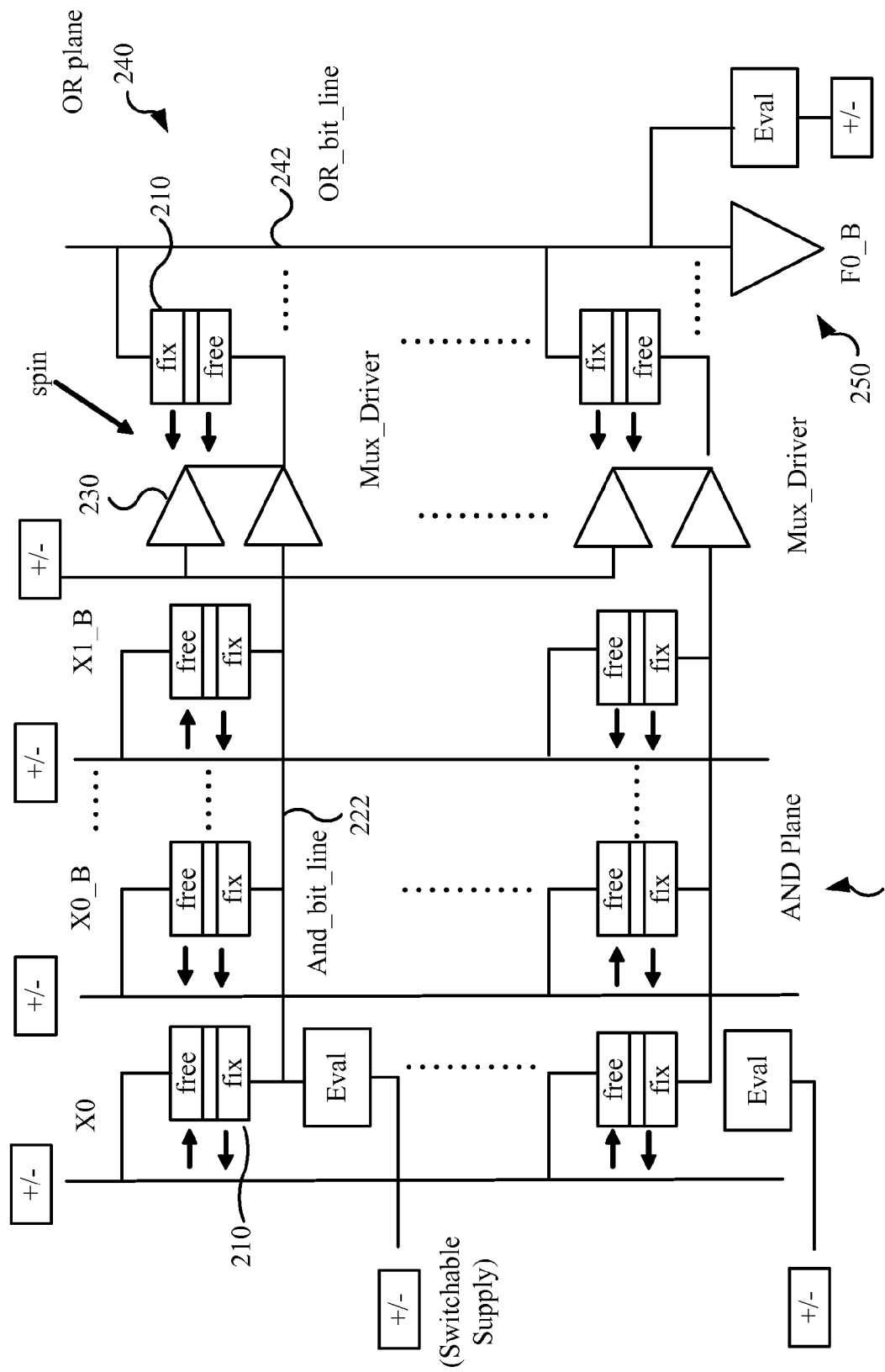
FIG. 2 is an illustration of software programmable logic having an AND input plane and an OR output plane using Spin Transfer Torque Magnetoresistive technology.

For example, the implementation illustrated in FIG. 2 allows for the realization of a complex function derived from individual memory and logic components. As illustrated in FIG. 2, software programmable function generation can be accomplished using the MTJ (e.g., 210) STT-MRAM cells in tandem with CMOS gates and switching supplies to allow for writable and readable "AND" (220) and "OR" (240) planes. The AND and OR plane topology facilitates full logic construction. For example, the function F0_B=X0_B+X1_B can be realized (where _B denotes the complement of a given logic signal), as illustrated. Output F0_B (250) receives signals from the individual MTJ 210 storage elements coupled in the AND plane 220 which is coupled through MUX drivers 230 and an MTJ 210 storage elements to the OR plane 240. The AND plane 220 can include one or more AND bit lines 222 coupled to individual MTJ storage elements 210. A plurality of AND bit lines 222 can be combined to form words of arbitrary bit sizes. Likewise, OR plane 240 can include one or more OR bit lines 242 coupled to MTJ storage elements 210 and a plurality of OR bit lines 242 can be combined to form words of arbitrary bit sizes. A more detailed description of the topology and exemplary configurations will be provided in more detail in the following sections.

Figure 3A:
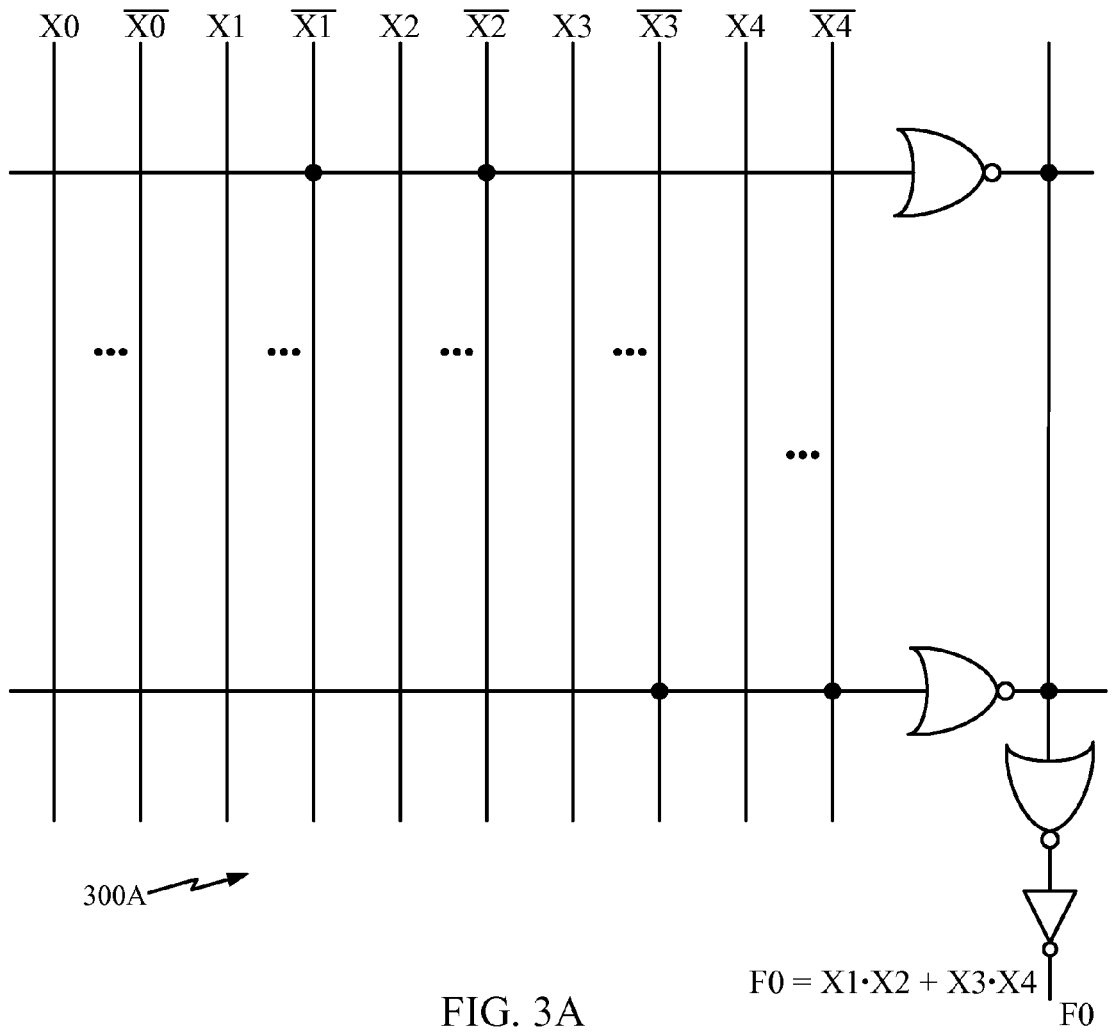
FIG. 3A is an illustration of software programmable logic having a NOR input plane and a NOR output plane.
Figure 3B:
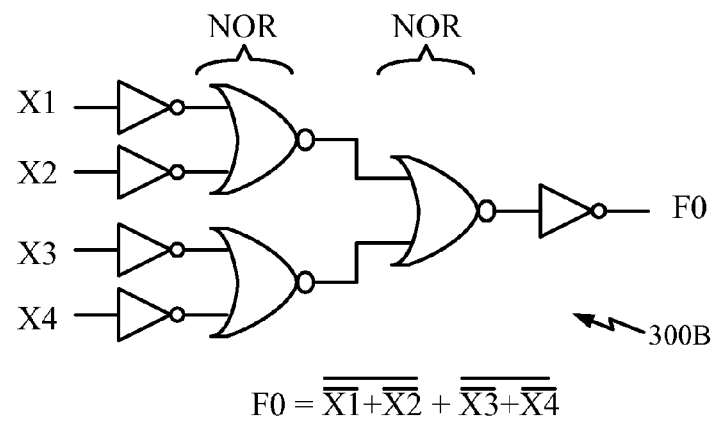
FIG. 3B is an illustration of a gate level implementation of the NOR-NOR programmable logic.

FIG. 3A illustrates a simplified schematic of a NOR-NOR PLA structure 300A. The structure illustrated can perform the function F0=$\overline{X1+X2}$+$\overline{X3+X4}$. In addition, an equivalent representation of the PLA logic in logic gates 300B is provided in FIG. 3B. The NOR-NOR configuration allows for both AND and OR operations to be realized. For example, the function illustrated also performs the logical function of F0=X1·X2+X3·X4. Accordingly, complex positive and negative logic can be performed using basic inverters and gates or equivalent planes in the PLA, as discussed herein.

Figure 4A:
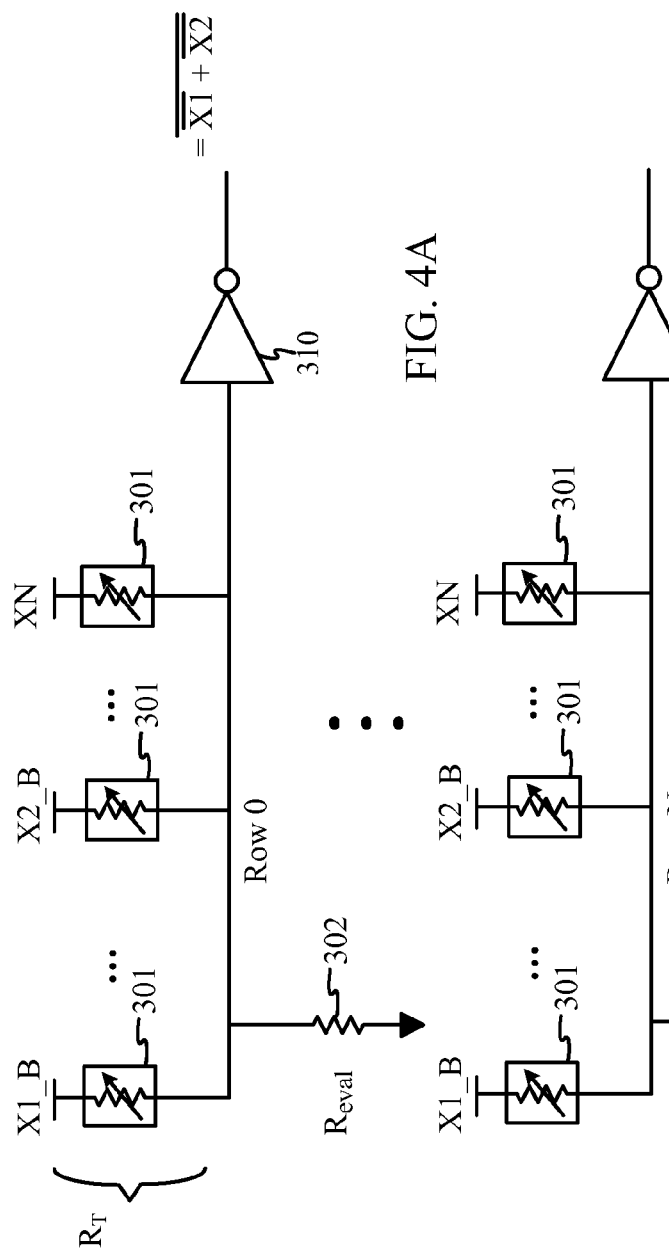
FIG. 4A is a schematic illustration of rows of the array of FIG. 3 using Spin Transfer Torque Magnetoresistive technology.

Referring to FIG. 4A, the NOR-NOR logic structure 300 can be implemented using STT technology in order to realize the function F0=X1·X2+X3·X4. For example, in the NOR- NOR structure 300, a plurality of STT-MTJs (e.g., 301 as illustrated in FIG. 4A) can be coupled together in Rows 0 through Row N. There are evaluation circuits 302 at the inputs to Rows 0 to N, and an evaluation circuit can also be located at the output of the logic structure 300 (e.g., see FIG. 5). Each of the evaluation circuits includes a software programmable positive/negative (+/−) source, which can be set to the minimum voltage during read operations. The (+/−) source can be configured for either state for write/programming operations depending on the state to be written to the MTJs 301. The write/programming operation is described in greater detail below in relation to FIG. 5.

Each of the columns associated with MTJs 301 includes inputs which are applied via lines X0, X0_B, X1, X1_B, . . . XN, XN_B. There are drivers coupled before the inputs of the last STT-MRAM cells 301 in Rows 0-N, and an inverting sense amp 310 at their output. The output of the inverting sense amp 310 provides the function realized by each row. Accordingly, the output of the row will be inverted (e.g., a high signal will result in a low output), which will be described in greater detail below.

FIG. 4A is an example of a functional illustration of rows of the NOR-NOR logic structure 300 for read operations. Assuming the inputs X1_B and X2_B (alternatively denoted as $\overline{X1}$ and $\overline{X2}$) are the inputs of interest in Row 0, then the resistance values of MTJs in those rows can be set low by programming a "0" or setting the MTJ to a parallel magnetization state. The remaining columns can be set to a high resistance state by programming a "1" or setting the MTJ to an anti-parallel magnetization state. Accordingly, a high logic value on either or both of X1_B or X2_B will result in a high logic state on row 0. It will be appreciated that the values used herein are merely for illustration and other configurations may allow for a "0" to be a high resistive state and a "1" to be a low resistance state. Accordingly, embodiments of the invention are not limited to the illustrated configurations or associated values.

Figure 4B:
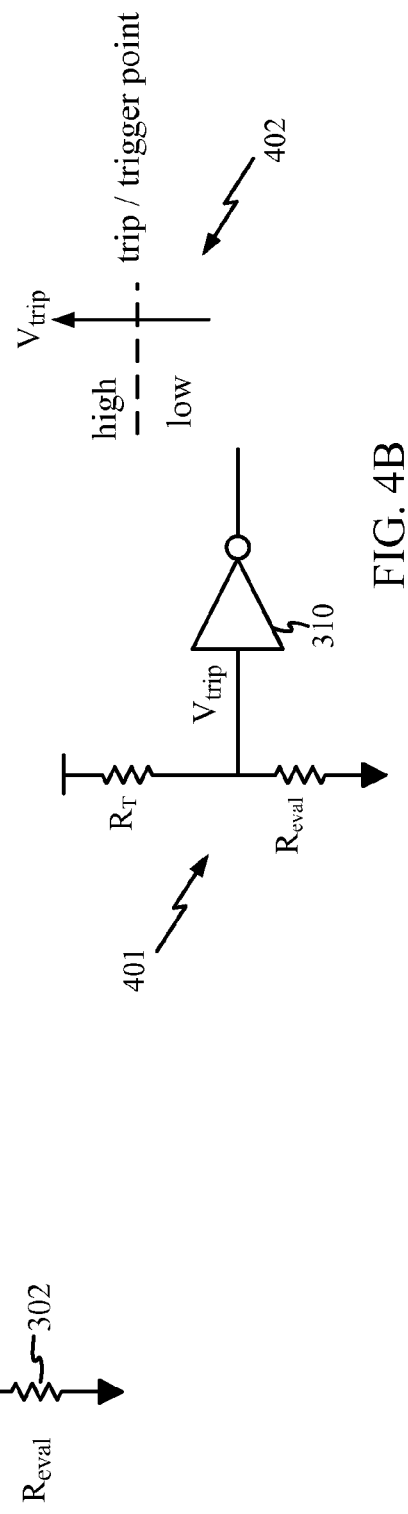
FIG. 4B is an illustration of an equivalent circuit of the schematic of FIG. 4A.

As illustrated schematically, MTJs 301 can be considered a programmable resistance. The resistances of all the MTJs 301 along a given row can be effectively considered to yield an equivalent resistance $R_T$, which in combination with the effective resistance of the evaluation circuit (Reval) can be represented as a voltage divider 401, in FIG. 4B, that will produce a voltage $V_{trip}$ (or a trigger voltage) on the row for a given input voltage at the inputs (e.g., X1_B, X2_B, etc.) or from the equivalent current from the input columns. The voltage $V_{trip}$ can have a range for both high and low depending on the trip point of inverter 310, as illustrated in 402. Accordingly, circuit design considerations include adjusting the trip point low enough so that a single high logic state on an active input (e.g., X1_B or X2_B) will be detected as a high and cause the output of inverting sense amp 310 to go low. Correspondingly, the trip point can be adjusted so any leakage current from the unused inputs (e.g., X3, X4, etc.) do not cause a false positive logic state to be activated. Since the complementary inputs of X1 and X2 are used in determining the state of Row 0 (e.g., the value of $V_{trip}$) which is input to inverting sense amp 310, the output of inverting sense amp 310 is the function $\overline{X1+X2}$ or X1·X2. Likewise, other functions can be realized for other rows and these logical functions can be combined into more complicated logical functions. It will be appreciated that since both the inputs, outputs and their respective complements (e.g., X0 and $\overline{X0}$) are available, the various desired functions can be DeMorganized to be achievable via the various logic planes (e.g., AND plane, OR plane, NOR plane). Further, since the MTJs 301 can be programmed to either a high or low resistance the functional logic of each plane can be reconfigurable.

Figure 5:
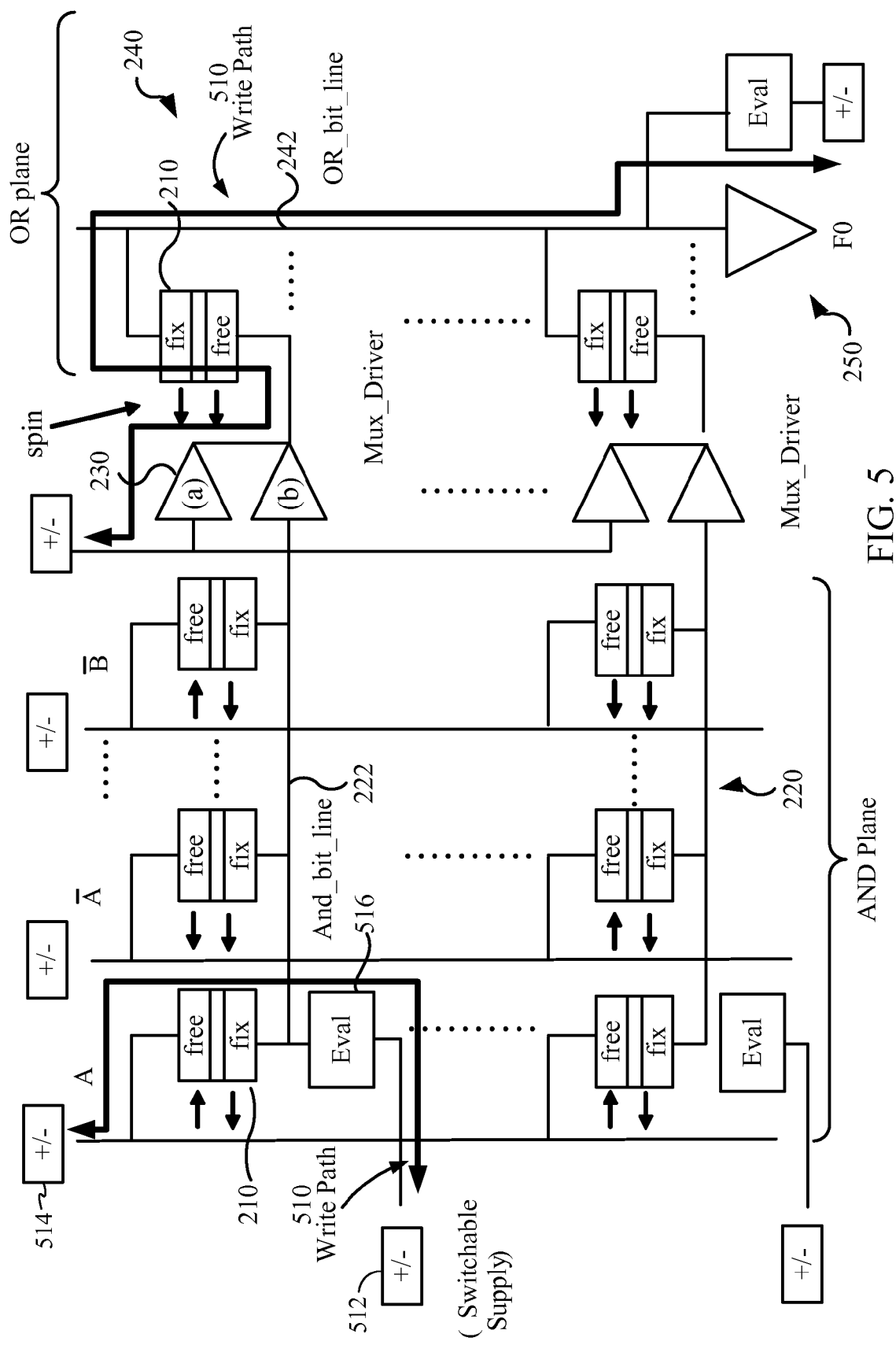
FIG. 5 is an illustration of programming the individual memory cells in a logic array.

Referring to FIG. 5, an illustration of programming the individual MTJs 210 is provided. As discussed above, the MTJs 210 can be "programmed" to either a relatively high resistance or low resistance state by setting the MTJ 210 to an anti-parallel or parallel magnetization state, respectively. Accordingly, for purposes of illustration, the high resistance state will be represented as a logic state 1 and the low resistance state will be represented as a logic state 0. The programmable array of FIG. 5 is similar to that illustrated in FIG. 2 so like reference numbers will be used and a detailed discussion of the elements will not be provided. As illustrated, each MTJ 210 can be programmed by establishing a write path (e.g., 510) between software programmable positive/negative (+/−) sources 512 and 514. Specifically, a write current can be sourced between the supplies 512 and 514 by placing the remaining logic paths (e.g., $\overline{A}$ to $\overline{B}$) to a high impedance state and setting the supplies 512 and 514 to the desired polarity to write a "1" or "0" state to the selected MTJ 210. It will be appreciated that this programming process can be repeated for all MTJs in the AND plane 220.

Likewise, MTJ 210 along write path 520 can be programmed by (+/−) sources 522 and 524. Specifically, a write current can be generated between the supplies 522 and 524 by placing the remaining logic paths in the OR Plane 240 to a high impedance state and setting the (+/−) sources 522 and 524 to the desired polarity to write a "1" or "0" state (e.g., a high resistance or low resistance state) to the selected MTJ. As illustrated, a portion (e.g., (a)) of the MUX driver 230 can be enabled to allow for the write operations and the read portion (e.g., (b)) can be set to a high impedance state during the write operations. It will be appreciated that the write portion (a) of 230 can allow for bidirectional current flow so that both states can be programmed into the selected MTJ. Also, it will be appreciated that the functionality of MUX driver 230 can be implemented as independent devices and embodiments of the invention are not limited to the illustrated devices or topology. Accordingly, any device or combination of devices that can perform the functionality discussed above can be used in place of MUX driver 230.

Figures 6A, 6B:
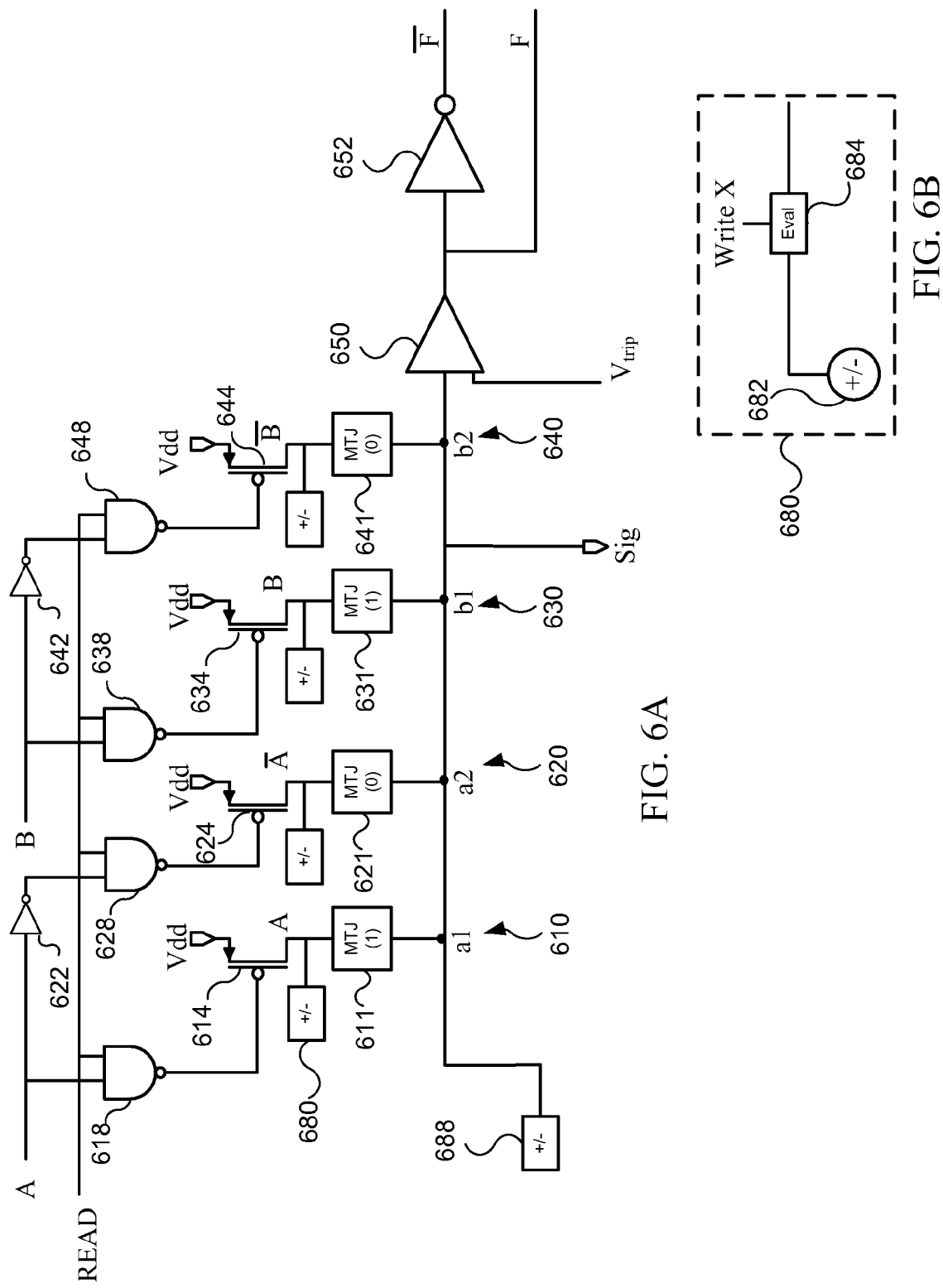
FIG. 6A illustrates an example of the input circuit for a programmable and reconfigurable logic array using Spin Transfer Torque Magnetoresistive technology.
FIG. 6B illustrates an example of a switchable power source used in the circuit of FIG. 6A.

FIG. 6A illustrates an example of the input circuit for a STT programmable logic circuit. As illustrated, inputs A and B can be supplied to logic paths 610, 620, 630 and 640 to provide results for both the input A and B and their complements $\overline{A}$ and $\overline{B}$. In the example illustrated, input A is provided to PMOS transistors 614 and is inverted by inverter 622 and provided to PMOS transistor 614 via NAND gates 618 and 628, respectively. Likewise, input B is provided to PMOS transistors 634 and is inverted by inverter 642 and provided to PMOS transistor 644 via NAND gates 638 and 648, respectively.

NAND gates 618, 628, 638 and 648 also receive an input from a READ signal. Accordingly, the NAND gates function to place the read logic paths 610, 620, 630 and 640 into a high impedance state when a read operation is not active. This allows for the independent programming of MTJs 611, 621, 631, 641, such as discussed in relation to FIG. 5. However, it will be appreciated that the NAND gate configuration is provided merely as an example and any suitable device can be used to achieve similar functionality.

Accordingly, when input A has a high voltage level and the READ signal is high PMOS transistor 614 will be activated. As noted above, input A is also supplied via inverter 622 to PMOS transistor 624 which is activated in the opposite logic state of the path of 610 (e.g., activated on a low voltage of input A) so that the complement to input A is provided. In a similar manner when the READ signal is high, input B is provided to PMOS transistor 634 and also provided via inverter 642 to PMOS transistor 644 to provide both B and its complement to paths 630 and 640, respectively.

As noted above, the logical state "1" or "0" (e.g., a high or low resistance state) of the STT Magnetoresistive devices (STT MTJs or MTJs) can be programmed into each STT MTJ (e.g., 611, 621, 631, 641), using the associated software programmable positive/negative (+/−) sources 680 and 688, as discussed above. This programmability provides for a reconfigurable logic array in regard to logic functions of each plane as will be discussed in greater detail below. Also, as noted above, during the programming operations, the read path is placed in a high impedance state to allow for the selection and programming of each MTJ. FIG. 6B illustrates an example of (+/−) sources 680. As illustrated, a programmable power supply 682 can be coupled to an Eval circuit 684 which allows for the programmable power source 680 to also be individually enabled or disabled. The Eval circuit 684 may be a CMOS device such as a transmission gate or any other device that allows for the individual coupling of the power source 682. The activation of the Eval circuit 684 can be controlled by a WRITE X signal, where X is the column that is being written as each programmable source 680 can be coupled to a column of one or more MTJ cells (see, e.g., FIG. 5). Programmable source 688 can be similarly configured as illustrated in FIG. 6B, however the Eval circuit will be activated on both read and write operations for each selected row. During the read operation the supply 682 would be set to the low voltage (which may be ground or a negative voltage), so the resulting circuit would be similar to the read illustration of FIGS. 4A and 4B. Alternatively, programmable source 688 could have separate circuits for read and write. For example, the write portion could be configured as illustrated in FIG. 6B and the read portion could have an Eval circuit coupled directly to ground and controlled by the READ signal. Accordingly, it will be appreciated foregoing circuit examples are merely for illustration purposes and are not intended to limit the scope of embodiments of the invention.

In reviewing the topology of the programmable logic array, such as illustrated in FIG. 5, it will be appreciated that similar logic configurations can be used for the output plane (e.g., 240), where each MTJ in the output plane can be programmed to be either a low or high resistance and the output of each row can be supplied as the input into each corresponding MTJ. Likewise the programmable sources can be similar for programming each of the MTJs in the output plane and the write portion of MUX (e.g., 230) can be used to select each MTJ to be written. Alternatively, individual programmable sources can be supplied for each output MTJ and the corresponding MUX could be simplified to only provide a read function. During the read operation, the result of the signals from the MTJs in the output plane can be can be sensed by a sense amplifier (e.g., 250) and set to either a logical 1 or 0 based on a threshold as discussed above, in relation to the read operation for each row.

To aid in an understanding of the operation of the various logic configurations, a truth table is provided below for input A for a given state of the related MTJs 611 and 621. Specifically, as shown, when input A is in a high state (1), the values at both nodes a1 and a2 are a logical 0. Accordingly, the output F will be a logical 0 and the compliment of F will be a logical 1. In contrast when, input A is at a logical 0, the value at node a1 remains a 0, but the value at node a2 is a logical 1, which will result in the output F being a logical 1 and the compliment of F will be a logical 0.

TABLE 1

STT Logic Truth Table

| Input A | MTJ State | Node (a1, a2) | Out (F) | Out (F_B) |
|---------|-----------|---------------|---------|-----------|
| 1       | 1         | 0 (a1)        | 0       | 1         |
|         | 0         | 0 (a2)        |         |           |
| 0       | 1         | 0 (a1)        | 1       | 0         |
|         | 0         | 1 (a2)        |         |           |

As illustrated, F is provided by buffering the voltage at Sig with sense amplifier 650, which functions to switch from high to low once a given threshold or trip/trigger level (e.g., $V_{trip}$) is reached. Likewise, the complement of F is provided from the output of inverter 652. However, it will be appreciated that embodiments of the invention are not limited to this configuration. For example, the sense amplifier could have an inverted output and then be coupled in series with another inverter which could be used to provide inverted logic relative to the voltage at Sig and the complement of the inverted logic. It will further be appreciated that the use of logical values such as 0 does not imply that there is a zero voltage at node a1 or a2 but merely means that the voltage level at Sig is not sufficient to trigger a logical 1 as sensed at output F. For purposes of this explanation, it is assumed that paths 630 and 640 are in a high impedance state and do not contribute to the voltage at Sig. The impact of the various logic levels are discussed in greater detail below, in relation to FIG. 7.

Figure 7:
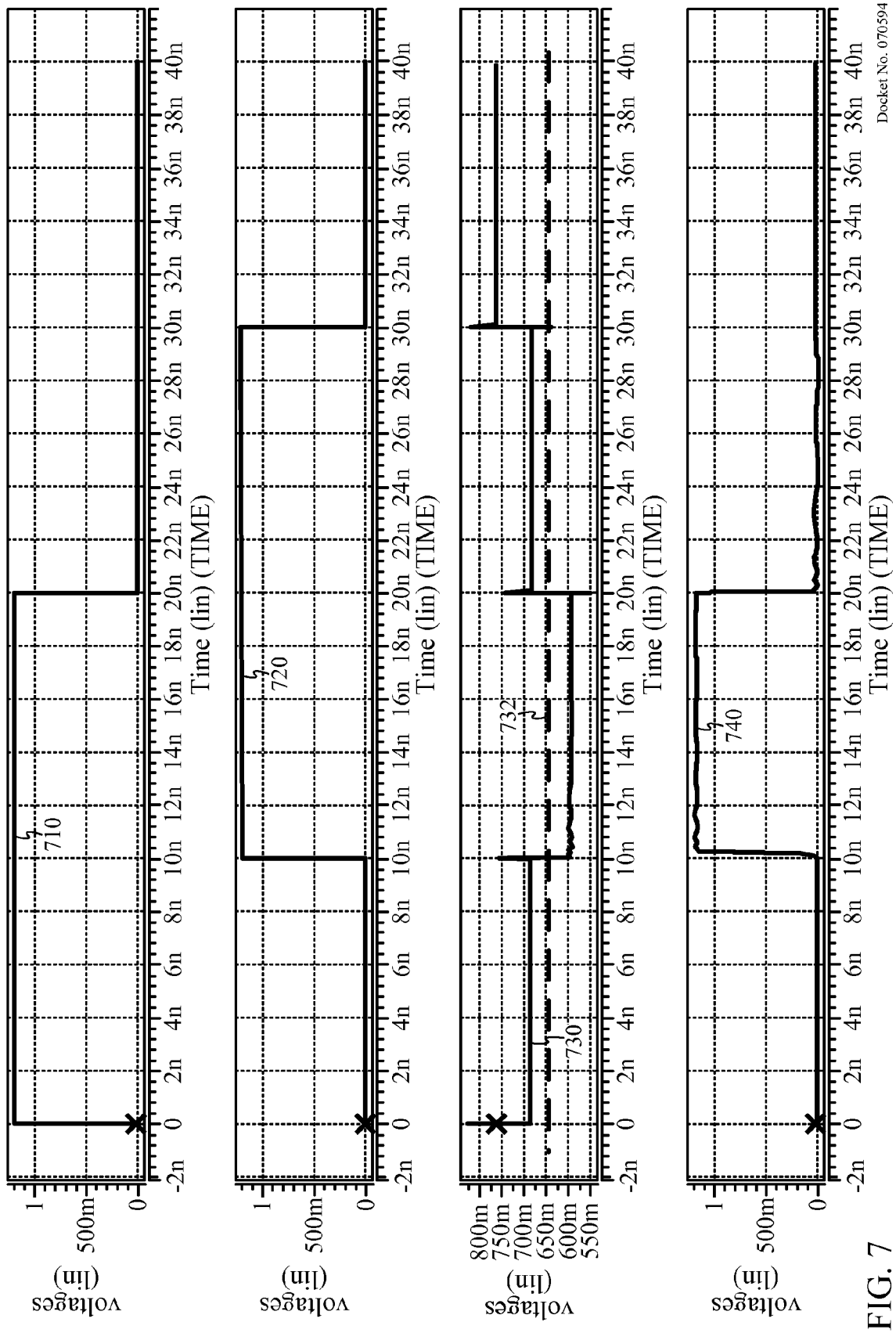
FIG. 7 is a chart illustrating various voltage levels for signals for an AND configuration.

FIG. 7 illustrates simulations for a logic configuration such as illustrated in FIG. 6. The charts show the respective voltage levels for inputs A and B and can be considered to have four quadrants that map to the four binary state combinations of the inputs (e.g., 10, 11, 01, 00). Further, a trigger/trip point value 732 can be set to determine the ultimate output state of that row of the array (see, e.g., FIG. 4B) based on the Sig voltage 730 of the row feeding the sense amplifier. The output voltage 740 is plotted to show the logic functioning for various input conditions. It should be noted that the sense amplifier for the output voltage 740 is assumed to be the inverted output for the graph illustrated. For example, if the Sig voltage 730 is below the trigger point voltage 732, then the output voltage 740 is high. Likewise, if the Sig voltage 730 is above the trigger point voltage 732, then the output voltage 740 is low.

When input A is high and input B is low, the there will still be a leakage path through the STT MTJ devices and the voltage at Sig 730 will rise to a certain level as indicated in the first quadrant of the chart of FIG. 7. This value of Sig is essentially repeated in the third quadrant, where input A is low and input B is high. The lowest voltage level for Sig 730 occurs in the second quadrant when both inputs A and B are high. Due to the configuration of the logic array, such as illustrated in FIG. 6A, when both inputs A and B are high, they are coupled to high resistance paths through STT devices 611 and 613 respectively. In contrast, when both A and B are low in the fourth quadrant, the highest voltage level for Sig 730 occurs, because both paths 620 and 640 will be active which have MTJs 621 and 641 set to a low resistive state. Accordingly, Sig 730 is greater than the trigger point 732 and the output 740 is low for this condition. It will be appreciated that the graph for the non-inverted output would result in an output graph having the opposite state. A truth table representation is provided in Table 2 below for the graph of FIG. 7.

TABLE 2

| Input A | Input B | Output |
|---------|---------|--------|
| 1 | 0 | 0 |
| 1 | 1 | 1 |
| 0 | 1 | 0 |
| 0 | 0 | 0 |

As discussed above, it will also be appreciated that the logic planes can be reconfigurable by reprogramming the values of the MTJs. For example, if the values of MTJs 611, 621, 631 and 641 are inverted then the logic realized by the row illustrated in FIG. 6A can be changed to an OR function. For example, if MTJs 611 and 631 are programmed to the '0' or low resistance state, then the voltage on Sig will be at an elevated state when either input A or B is high and at its highest state when both are high. The voltage will be at its lowest state when both inputs A and B are low. Accordingly, the output of the row can realize an OR function as illustrated in the truth table represented in Table 3 below.

TABLE 3

| Input A | Input B | Output |
|---------|---------|--------|
| 1 | 0 | 1 |
| 1 | 1 | 1 |
| 0 | 1 | 1 |
| 0 | 0 | 0 |

Accordingly, it will be appreciated that embodiments of the invention include both programmable and reconfigurable aspects using the STT MTJ devices in the logic array. Further, it will be appreciated that embodiments of the invention are not limited to the illustrated configurations. Embodiments of the invention can be software programmable via topology and arrangements and include, programmable decode functions, extensible instruction sets, and on-the-fly hardware logic addition/manipulation via software programming. Further, embodiments of the invention can include designs that are executable in parallel without need for a clock to synchronize data transfer. Accordingly, using the STT MTJ devices, input planes and output planes and associated drivers as building blocks, embodiments of the invention can be configured to achieve complex functionalities.

While the foregoing disclosure shows illustrative embodiments of the invention, it should be noted that various changes and modifications could be made herein without departing from the scope of embodiments of the invention as defined by the appended claims. The functions, steps and/or actions of the methods in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A programmable logic array, comprising:
    a plurality of spin transfer torque magnetic tunnel junction (MTJ) devices, arranged in an array;
    a plurality of programmable sources coupled to corresponding MTJ devices for changing the polarity of a free layer of each MTJ device;
    wherein a first group of the MTJ devices are arranged into an input plane,
    wherein a second group of the MTJ devices are arranged into an output plane, and
    wherein the input plane and the output plane are combined to form a logic function based on the relative polarities of the free layer of each MTJ device; and
    an output sense amplifier coupled to the output plane configured to detect a signal level on a column of the output plane and to generate a binary output based on a comparison of the signal level on the column of the output plane to a threshold signal level.

2. The programmable logic array of claim 1, wherein each MTJ device contains a magnetic tunnel junction (MTJ) storage element that can be electrically programmed to a low resistance or high resistance state.

3. The programmable logic array of claim 2, wherein each row in the array is coupled to input columns via one of the plurality of MTJ devices.

4. The programmable logic array of claim 3, wherein a first input column is selected in a first row by setting a first MTJ coupling the first row to the first column to a low resistance state.

5. The programmable logic array of claim 4, wherein a second input column is not selected in a first row by setting a second MTJ coupling the first row to the second column to a high resistance state.

6. The programmable logic array of claim 4, wherein a first programmable source from the plurality of programmable sources is coupled to a column coupled to the first MTJ and a second programmable source from the plurality of programmable sources is coupled to a row coupled to the first MTJ.

7. The programmable logic array of claim 6, wherein the first programmable source and second programmable source are configured to provide a programming current for the first MTJ during a write operation.

8. The programmable logic array of claim 7, wherein the second programmable source is configured to provide a voltage sink during a read operation.

9. The programmable logic array of claim 1, wherein the input plane is a NOR plane and the output plane is a NOR plane.

10. The programmable logic array of claim 1, wherein the input plane is an AND plane and output plane is an OR plane.

11. A programmable logic array, comprising:
    a plurality of spin transfer torque magnetic tunnel junction (MTJ) devices, arranged in an array; and
    a plurality of programmable sources coupled to corresponding MTJ devices for changing the polarity of a free layer of each MTJ device;
    wherein a first group of the MTJ devices are arranged into an input plane,
    wherein a second group of the MTJ devices are arranged into an output plane, and
    wherein the input plane and the output plane are combined to form a logic function based on the relative polarities of the free layer of each MTJ device; and
    a MUX driver coupled between the input plane and output plane, wherein the MUX driver is configured to provide a read signal from a first row of the input plane to a MTJ of the output plane.

12. The programmable logic array of claim 11, wherein the MUX driver comprises a sense amplifier configured to detect a voltage level on the first row and to generate a binary output voltage based on a comparison of the voltage level on the first row to a threshold voltage.

13. The programmable logic array of claim 11, wherein the MUX driver comprises a write portion configured to couple the MTJ in the output plane to one of the plurality of programmable sources associated with the output plane.

14. The programmable logic array of claim 13, wherein one of the plurality of programmable sources is coupled to a column coupled to the MTJ in the output plane.

15. The programmable logic array of claim 1, wherein the signal level is a voltage and wherein the threshold signal level is a voltage.

16. A method for implementing logic in an array comprising:

programming each of a plurality of spin transfer torque magnetic tunnel junction (MTJ) devices, arranged in an array to either a high or low resistance state, wherein each MTJ device is programmed by a first programmable source coupled to a free layer side of a selected MTJ device and programmable source coupled to a fixed layer side of the selected MTJ device;

arranging a first group of the MTJ devices into columns and rows of an input plane;

arranging a second group of the MTJ devices into at least one column in an output plane, wherein outputs of each row are coupled the MTJ devices in the at least one column; and determining a logic function based on the relative resistances of each MTJ device.

17. The method of claim 16, further comprising:

coupling a plurality of inputs, each input coupled to at least one MTJ device in corresponding input columns in the input plane;

coupling a plurality of MTJ devices from different input columns to a first row in an input plane, wherein a first programmable source from the programmable sources is coupled to the row;

generating a voltage on the first row by enabling the plurality of inputs and setting the first programmable source to a low voltage state; and generating a binary output voltage based on a comparison of the voltage on the first row to a threshold voltage.

18. The method of claim 16, further comprising:

coupling output voltages of rows in the input plane to corresponding MTJ devices in a first column in the output plane;

setting a programmable source coupled to the first column in the output plane to a low voltage state to establish a voltage on the first output column; and generating a binary output voltage for the output plane based on a comparison of the voltage on the first column in the output plane to a threshold voltage.

19. The method of claim 16 comprising:

reconfiguring a logic function realized by at least one of the input plane or output plane by reprogramming each of the plurality of spin transfer torque magnetic tunnel junction (MTJ) devices in the one of the input plane or output plane.

20. The method of claim 19, wherein the reconfiguring the logic function comprises changing the resistance state of each of the plurality of spin transfer torque magnetic tunnel junction (MTJ) devices in the one of the input plane or output plane.

* * * * *

UNITED STATES PATENT AND TRADEMARK OFFICE
CERTIFICATE OF CORRECTION

| | | |
|---|---|---|
| PATENT NO. | : 7,728,622 B2 | Page 1 of 1 |
| APPLICATION NO. | : 12/055794 | |
| DATED | : June 1, 2010 | |
| INVENTOR(S) | : Chua-Eoan et al. | |

It is certified that error appears in the above-identified patent and that said Letters Patent is hereby corrected as shown below:

Column 11, line 29, claim 17: "an input" to read as --the input--

Column 11, line 29, claim 17: "a first" to read as --the first--

Column 12, line 16, claim 18: "a threshold" to read as --the threshold--

Signed and Sealed this
Twelfth Day of July, 2011

David J. Kappos
*Director of the United States Patent and Trademark Office*